(12) United States Patent
Purcell et al.

(10) Patent No.: US 8,537,563 B2
(45) Date of Patent: Sep. 17, 2013

(54) MEMORY SYSTEM

(75) Inventors: Brian T. Purcell, Tomball, TX (US);
Melvin K. Benedict, Magnolia, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1161 days.

(21) Appl. No.: 11/859,601

(22) Filed: Sep. 21, 2007

(65) Prior Publication Data

US 2009/0080164 A1 Mar. 26, 2009

(51) Int. Cl.
*H05K 7/14* (2006.01)
*H05K 7/18* (2006.01)

(52) U.S. Cl.
USPC ........... 361/802; 361/796; 361/798; 361/801; 361/803

(58) Field of Classification Search
USPC .............. 361/778, 790, 796–803; 211/41.17
See application file for complete search history.

(56) References Cited

U.S. PATENT DOCUMENTS

| | | | | |
|---|---|---|---|---|
| 5,593,046 | A * | 1/1997 | Katsuura et al. | 211/41.15 |
| 5,967,814 | A * | 10/1999 | Sikorski, Jr. | 439/165 |
| 6,045,371 | A * | 4/2000 | Kagawa et al. | 439/74 |
| 6,328,169 | B1 * | 12/2001 | Matsuda et al. | 211/41.17 |
| 6,590,781 | B2 * | 7/2003 | Kollipara et al. | 361/760 |
| 7,009,848 | B2 * | 3/2006 | Ruckerbauer et al. | 361/785 |
| 7,180,755 | B1 * | 2/2007 | Reznikov | 361/797 |
| 7,280,373 | B2 * | 10/2007 | Aizawa | 361/803 |
| 7,891,937 | B2 * | 2/2011 | Mohamed | 414/810 |

* cited by examiner

*Primary Examiner* — Tuan T Dinh

(57) ABSTRACT

A system in some embodiments includes a system having a memory module having a first board comprising a first plurality of memory receptacles configured to support a first plurality of in-line memory modules in an overlapping relationship with a second plurality of in-line memory modules disposed on a second board. Further, a system in some embodiments includes rotating first and second memory boards into a parallel configuration via a hinge coupling the first and second memory boards, and inserting the first and second memory boards into first and second board connectors simultaneously.

22 Claims, 13 Drawing Sheets

MEMORY SYSTEM

BACKGROUND

This section is intended to introduce the reader to various aspects of art, which may be related to various aspects of the present invention that are described or claimed below. This discussion is believed to be helpful in providing the reader with background information to facilitate a better understanding of the various aspects of the present invention. Accordingly, it should be understood that these statements are to be read in this light, and not as admissions of prior art.

Computer systems are generally employed in numerous configurations to provide a variety of computing functions. For example, computer systems may include personal computer systems (e.g., desktop and laptop computers), as well as, commercial systems (e.g., servers or industrial computers). Each of these systems may rely on a plurality of components interacting to provide reliable computing power and bandwidth. For instance, computer systems may employ a combination of processors, memory, input/output devices, disk drives, power supplies, fans, and the like to operate effectively. As the demand for computing power increases, these systems may be expanded to provide computing for a growing number of applications. Generally, expanding the systems may include the addition of more components (e.g., processors and memory) to provide additional computing power.

Although expanding the system with additional components may be feasible in some systems, it may not be desirable in others. For example, in server applications, the system may be limited by space constraints that reduce the ability to expand the physical size of the system. For example, a chassis that encloses the system may be designed to fit within a standard server rack with a given width (e.g., 19-28 inches) and depth (e.g., 24-42 inches). Accordingly, any additional components to the system may be designed into the available space and volume. Similarly, other products, such as consumer desktops, may be limited in size by consumer demand. For instance, users may desire a powerful computer system housed in a compact form factor. Thus, it may be desirable for a computer system to house an increasing number of components in a limited volume or space. Further, it may be desirable that the components remain accessible to enable a user or service technician to access components (e.g., memory) without exposing them to a high potential of damaging the components. Accordingly, it may desirable that computer systems include a compact form factor that enables access to the components.

BRIEF DESCRIPTION OF THE DRAWINGS

Advantages of one or more disclosed embodiments may become apparent upon reading the following detailed description and upon reference to the drawings in which.

DETAILED DESCRIPTION OF SPECIFIC EMBODIMENTS

One or more exemplary embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
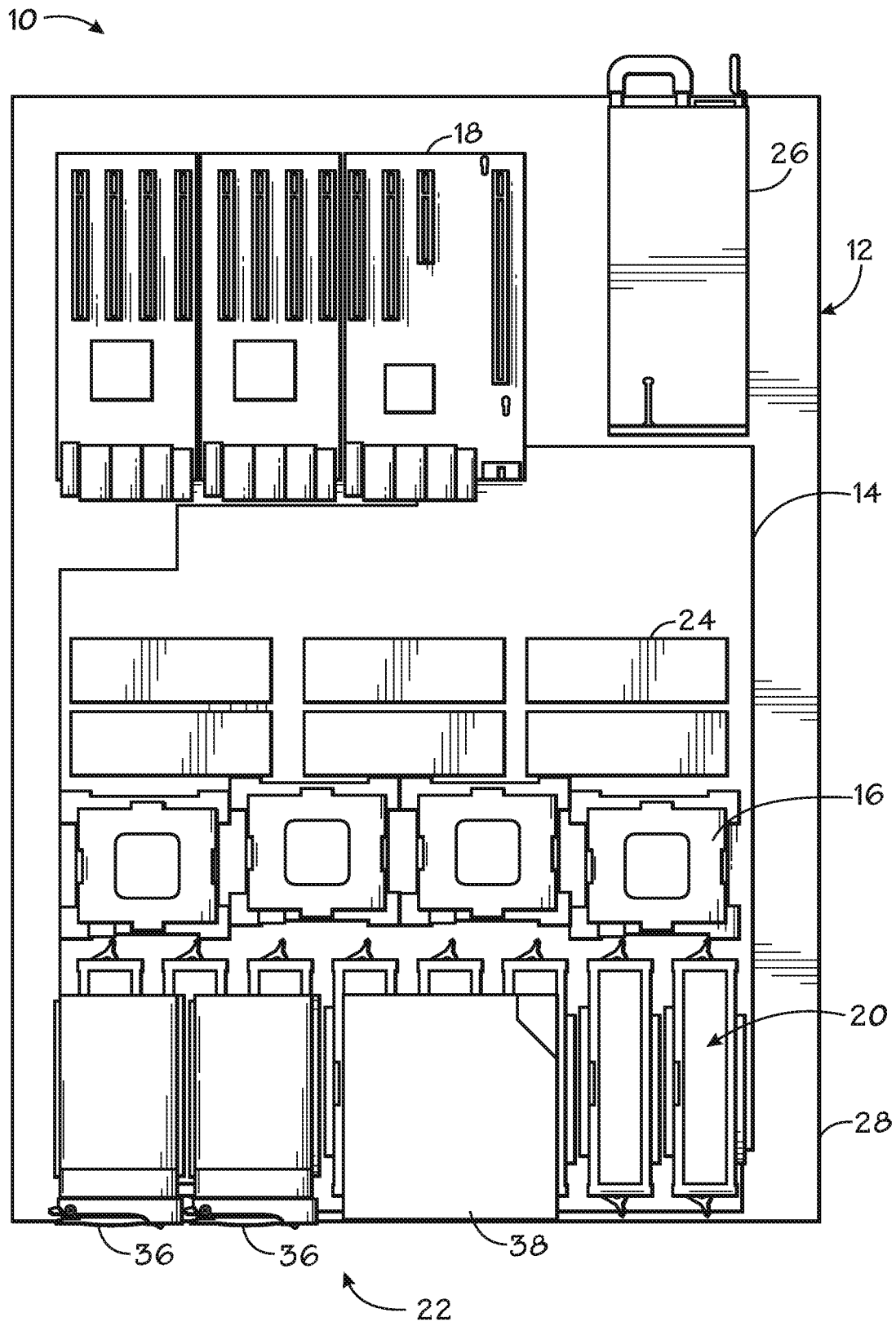
FIG. 1 is a top view of an embodiment of a computer system having memory modules arranged in a unique foldable memory book.
Figure 2:
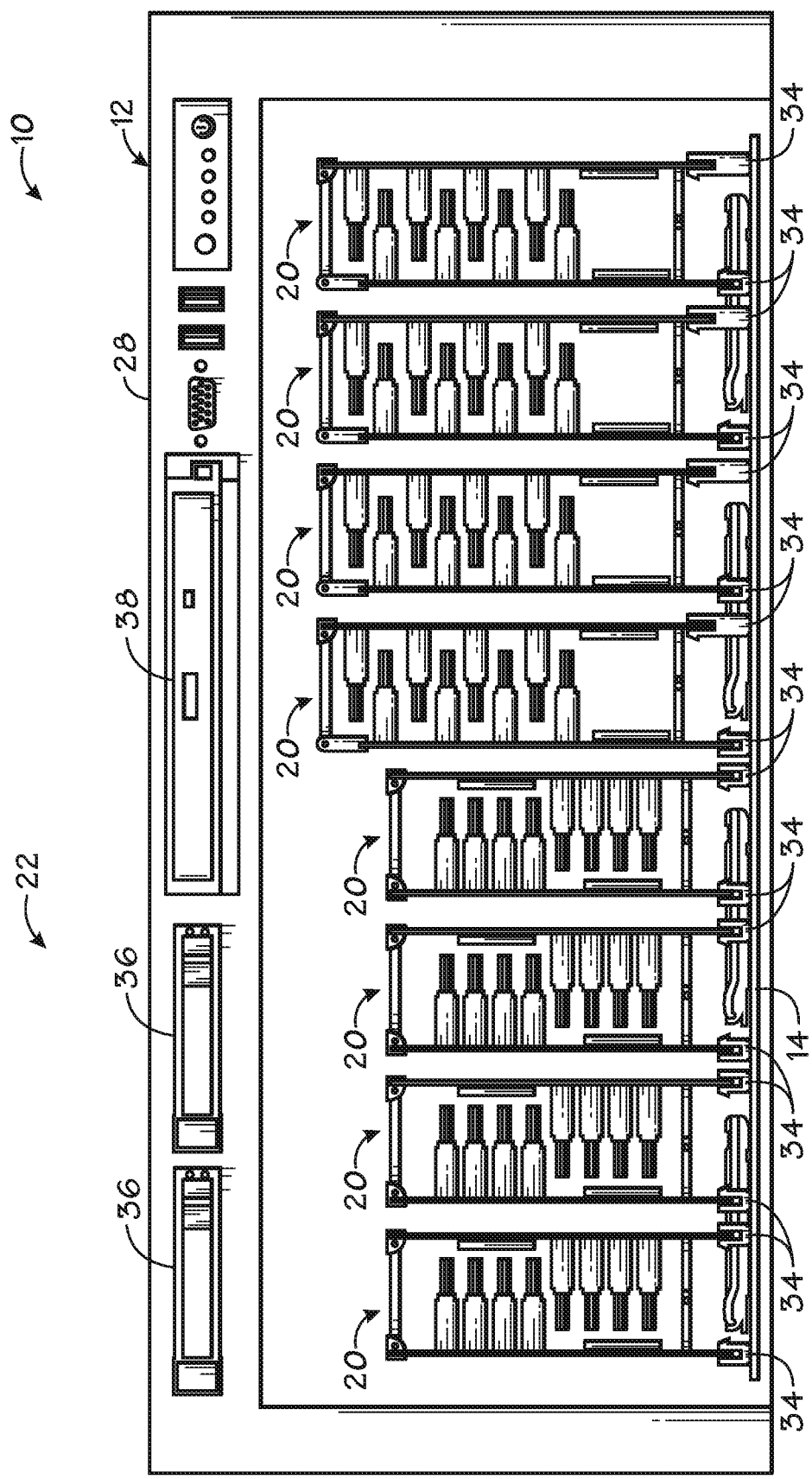
FIG. 2 is a side view of an embodiment of the computer system of FIG. 1.

FIGS. 1 and 2 illustrate top and side views of an embodiment of a computer system 10 having a foldable memory module (e.g., book) configured to support a plurality of in-line memory modules. As discussed in further detail below, the foldable memory module may include first and second boards that each support a plurality of in-line memory modules. For example, in certain embodiments, each of the boards is configured to support four in-line memory modules. Further, embodiments of the foldable memory modules may include coupling the first and second boards together via a hinge mechanism. For example, in certain embodiments, the hinge mechanism may enable the boards to fold proximate to one another (e.g., parallel with space for the memory in between) to enable installation of the boards into adjacent memory slots/connectors in the computer system. Further, in certain embodiments, the hinge may enable a user to unfold the memory module for access to each of the in-line memory modules. In other words, the foldable memory module may be folded closed for installation into a computer system, and unfolded to access each in-line memory module when the foldable memory module is removed from the computer system.

Embodiments may also include positioning in-line memory module connectors on the first and second boards such that when the memory module is folded (e.g., closed) the in-line memory modules of the first board overlap with the in-line memory modules of the second board. In other words, the portions of the in-line memory modules are disposed proximate to one another to provide a space savings as compared to not overlapping the in-line memory modules. For example, in certain embodiments, the in-line memory modules of the first board may be disposed near a top portion of the first board and the in-line memory modules of the second board disposed near a bottom portion of the second board. Thus, folding the memory module closed enables the in-line memory modules to overlap without mechanical interference (e.g., hitting one another). In other embodiments, the first board and second board may include a layout that staggers each of the in-line memory modules with a given offset. Accordingly, folding the memory module closed may enable each of the in-line memory modules of the first board to fit between or proximate to each of the in-line memory modules of the second board, such that there is an alternating overlap between the first board in-line memory modules and the second board in-line memory modules. In other words, there may be a gap between the in-line modules on each board such that the in-line memory modules may fit between one another when the boards are folded closed. Further, embodiments may include features, such as varying connector heights, latching mechanisms, clasps, guides, and the like.

Figure 12:
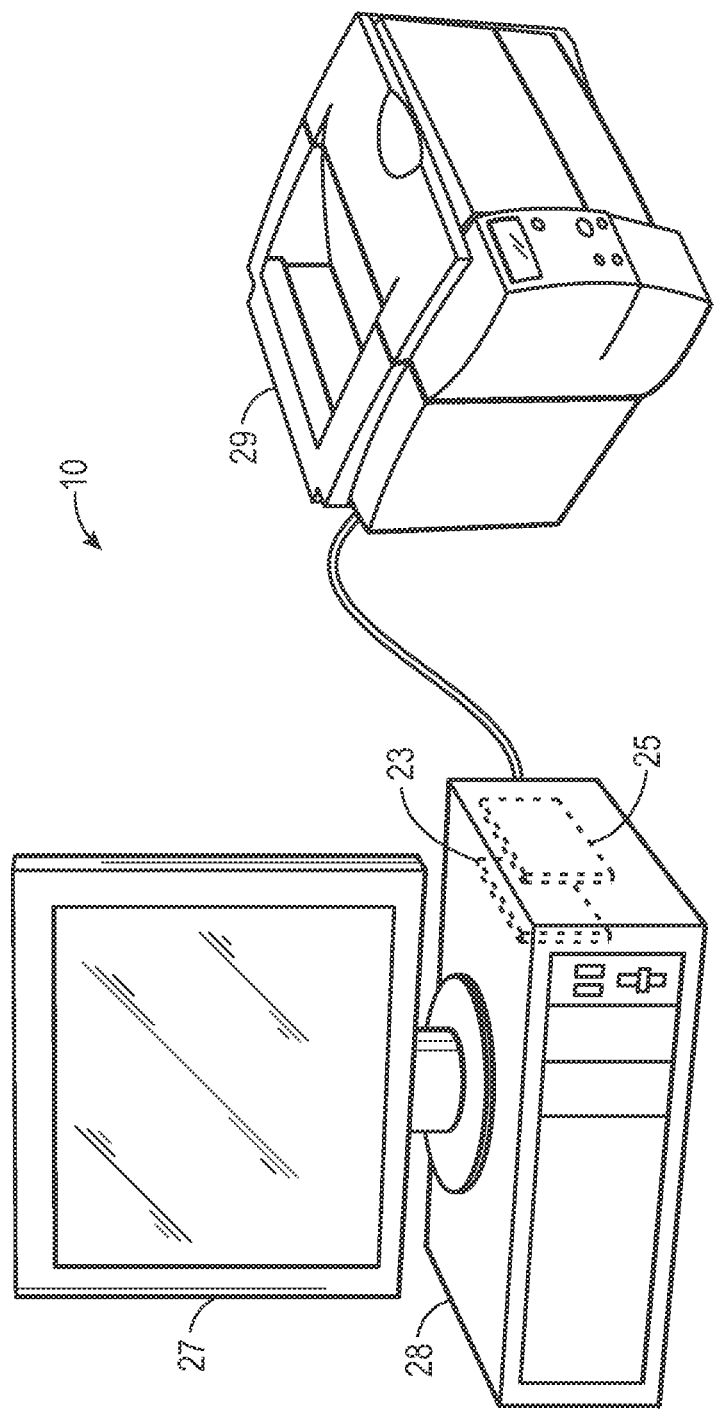
FIG. 12 is a front view of an embodiment of the computer system of FIG. 1.

An exemplary computer system 10 is illustrated in FIGS. 1, 2, and 12 in accordance with one embodiment of the present technique. In the illustrated embodiment, the computer system 10 includes a server 12 having various components, including a motherboard 14, processors 16, input/output (I/O) devices 18, memory modules 20, drives 22, an audio card 23, fans 24, a video card 25, and a power supply 26, all within a chassis 28. The drives 22 may include hard drives, optical drives, disk drives, or a combination thereof. The computer system 10 also may include a variety of peripheral devices, such as a keyboard, mouse, monitor 27, printer 29, camera, scanner, or a combination thereof.

The motherboard 14 may include a printed circuit board (PCB) or other hardware that enables connection and communication between the various components of the system 10. For example the motherboard 12 may include a printed circuit board (PCB) having a plurality of layers, electrical traces, connectors, integrated circuits (IC's), and the like to enable mounting of the components, and transmission of signals and power. In the illustrated embodiment, the processors 16, the I/O devices 18, the memory modules 20, and the fans 24 may be directly coupled to the motherboard 14. In other embodiments, additional components, including the drives 22 may be directly coupled or indirectly coupled (e.g., via a cable) to the motherboard 14.

The central processing unit 16 may include one or more processors that carry out various computing tasks of the system 10. For example, a processor 16 may include a processor manufactured by Intel Corporation of Santa Clara, Calif., or Advanced Micro Devices (AMD) Sunnyvale, Calif. In the illustrated embodiment, the system 10 includes a multi-processor configuration having four processors 16. In other embodiments, the system 10 may include a single processor 16 or any number of processors 16.

The input/output devices 18 may include connections to various external devices of the system 10. For example, the input/output devices 18 may include PCI (peripheral component interconnect) Express or PCI bus expander cards plugged into the motherboard via I/O connectors. Further, the I/O devices 18 may include peripherals, keyboards, USB (Universal Serial Bus) ports, serial ports, and the like.

The memory modules 20 may include a variety of memory devices and configurations. In certain embodiments, the memory modules 20 may include SIMMs (single in-line memory modules) or DIMMs (dual in-line memory modules) 32. For example, in the illustrated embodiment, the system 10 includes eight memory modules 20 that each includes eight in-line memory modules 32. Further, each of the memory modules 20 is coupled to the system 10 and the motherboard 14 via board sockets 34. Thus, the system 10 includes a total of sixty-four in-line memory modules 32 coupled to the motherboard 14 via sixteen board sockets 34.

The drives 22 may include hard drives, media drives, and the like. For example, in the illustrated embodiment, the drives 22 include two 2.5 inch SFF (small form factor) SAS (serial attached SCSI (small computer system interface)) hard drives 36 and a DVD-R/W (digital video disk-read/write) drive 38. Other embodiments may include 5.25 inch drives, external drives, or the like.

The fans 24 may provide for cooling of the system 10. For example, the fans 24 may circulate air through the chassis 28, and circulate air over the components to remove heat that is produced by the system 10 and its components. The illustrated embodiment includes six fans 24 internal to the system 10 that are configured to provide air flow through the chassis 28, and airflow across the processors 16, the I/O devices 18, the memory modules 20, the in-line memory modules 32, and the drives 22. Other embodiments may include alternate fan 24 configurations. For example, embodiments may include any number of fans 24 located internal and/or external to the chassis 28.

One or more power supplies 26 may provide power to the system 10. For example, in the illustrated embodiment, the power supply 26 may receive power via an alternating current (AC) or a direct current (DC) source, and transmit the power to each of the components via the motherboard 14, or other cabling internal to system 10. In other embodiments, the system 10 may include alternate power configurations and schemes. For example, other embodiments may include an external power supply 26 that delivers power to the system 10 via a common backplane or cabling.

As mentioned previously, the chassis 28 may provide an enclosure for each component of the system 10. For example, in the illustrated embodiment, the system 10 includes a 4U rack mount server chassis 28 configured to be mounted in modular rack mount server system. Similarly, the chassis 28 may include other form factors, such as a 4U rack mount server. Further, other embodiments may include a chassis 28 or enclosure generally associated with desktop computer systems, portable computer systems, industrial computer systems, and the like.

As mentioned previously, the system 10 may include multiple processors 16 and multiple memory modules 20. As will be appreciated, each of the processors 16 may rely on one or more of the memory modules 20 to store and access data that may be associated with processing functions. Further, in certain embodiments and configurations, each processor 16 may be capable of simultaneously supporting a plurality of memory modules 20 and in-line memory modules 32. For example, in the illustrated embodiment, each processor 16 is capable of supporting up to four memory channels connected to a remote memory buffer. Further, each remote memory buffer includes an interface to a standard DRAM (dynamic random access memory) interface that is capable of supporting four DIMM modules 32. In other words, each processor 16 is capable of supporting up to 16 DIMM modules 32. Thus, the four processors 16 of the system 10 are capable of supporting up to 64 DIMM modules 32. Accordingly, systems 10 that include an increased number of processors 16 may be capable of supporting a large number of in-line memory modules 32.

Although adding multiple processors 16 may enable the system 10 to support a plurality of in-line memory modules 32 (e.g., DIMMs), other constraints of the system 10 may limit the actual number of in-line memory modules 32 that the system 10 can support. For example, in the system 10 (e.g., a server system), the physical dimensions of the chassis 28 may limit the space available for each the components of the system 10. In other words, the standard size of the chassis 28 may limit expansion of the chassis 28 to provide enough space/volume to support an increased number of the in-line memory modules 32. Generally, each portion (e.g., zone) of the system 10 may consume its own volume and does not share or encroach in another zone of the system 10. For example, in the illustrated embodiment, there are four zones, including: the memory, the CPU, the fan, and the I/O zones. Accordingly, the zone remaining for the memory may include a function of the total system 10 volume minus the volume associated with the CPU, the fan, and the I/O zones. Thus, in the standard 4U chassis 28, subtracting the length of the I/O devices 18, the width of the fans 22, and the volume of the processors 16, and associated heat sinks, may drastically reduce the volume available for the in-line memory modules 32.

In a compact computer system 10, such as a server, the width and depth of the chassis 28 may be fixed relative to the width and depth of a standard server rack. Further, the overall height of the system 10 and the chassis 28 may be driven by physical constraints, as well as, desires of the consumer and industry trends. Accordingly, it may be desirable that a plurality of the in-line memory modules 32 be disposed in a limited volume. However, providing a plurality of in-line memory modules 32 in a limited volume may provide for additional challenges. Provided below is a system and method that addresses volumetric and other constraints associated with assembling a plurality of in-line memory modules 32 into a single chassis 28.

Figure 13:
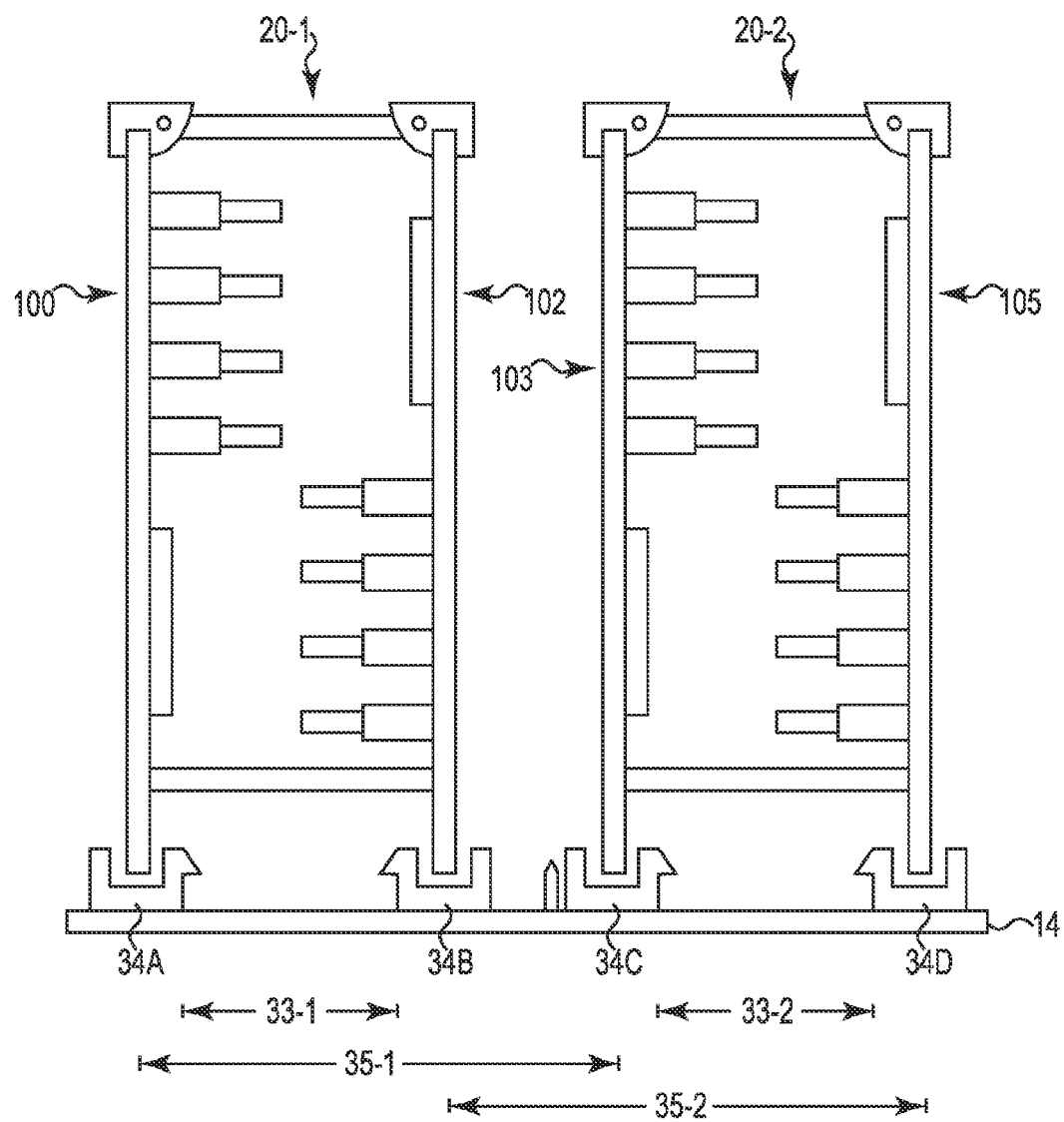
FIG. 13 is an end view of an embodiment of two memory modules of FIGS. 2 and 3.

In an exemplary embodiment, a plurality of memory modules is disposed in the chassis 28 in a foldable book-style configuration. For example, FIG. 2 illustrates the system 10 including sixty-four in-line memory modules 32 disposed in a plurality of memory modules 20 and FIG. 13 illustrates an embodiment of two memory modules 20-1, 20-2 of FIGS. 2 and 3. In the embodiments, each of the memory modules 20, 20-1, 20-2 includes foldable configuration that supports a plurality of in-line memory modules 32. For example, in the illustrated embodiments, each of the memory modules 20, 20-1, 20-2 includes eight in-line memory modules 32 that are coupled to the system 10 via tow board connectors 34, 34-A, 34-B, 34-C, 34-D disposed on the motherboard 14. The embodiments of the memory modules 20, 20-1, 20-2, each provide a compact form factor by overlapping the in-line memory modules 32 such that an increased number of in-line memory modules 32 is substantial higher than a normal mounting of memory modules, because the modules 32 are in closer proximity, overlapping, and so forth.

Figure 3:
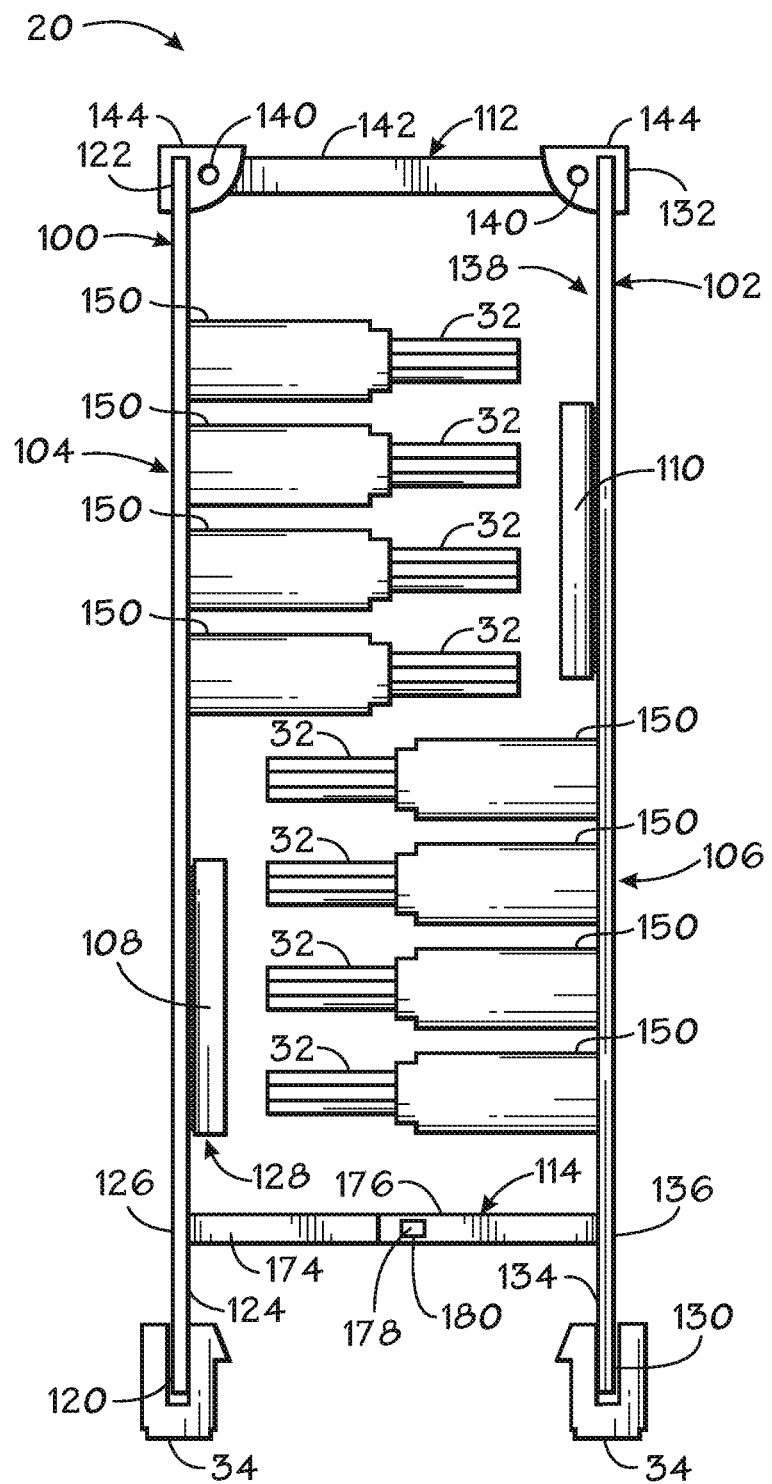
FIG. 3 is an end view of an embodiment of the memory module of FIGS. 1 and 2.

FIG. 3 illustrates an exemplary embodiment of the memory module 20 and FIG. 13 illustrates an exemplary embodiment of two of the memory modules 20-1, 20-1. In the illustrated embodiments, the memory module 20, 20-1, 20-2 includes a first memory board 100 (e.g. a third memory board 103), a second memory board 102 (e.g., a fourth memory board 105), a first set of in-line memory modules 104, a second set of in-line memory modules 106, a first memory controller 108, a second memory controller 110, a hinge 112, and a clasp 114. The first memory board includes a first board connection pins 120, a first hinge support edge 122, a primary face 124, a secondary face 126, and a component region 128. The second memory board 102 includes second board connection pins 130, a second hinge support 142, and hinge ends 144. The first set of memory modules 104 and the second set of memory modules 106 each include four in-line memory modules 32; thus the memory modules 20, 20-1, 20-2 includes a total of eight in-line memory modules 32. Further, the illustrated embodiments includes include board connectors 34, 34-A, 34-B, 34-C, 34-D coupled to the memory module 20, 20-1, 20-2. Illustrated in the embodiments of FIGS. 2 and 13 the board connector 34, 34-A 34-B 34-C 34-D can be separated by a first distance 33-1 and a second distance 35-1 from another on the circuit board 14.

Figure 4:
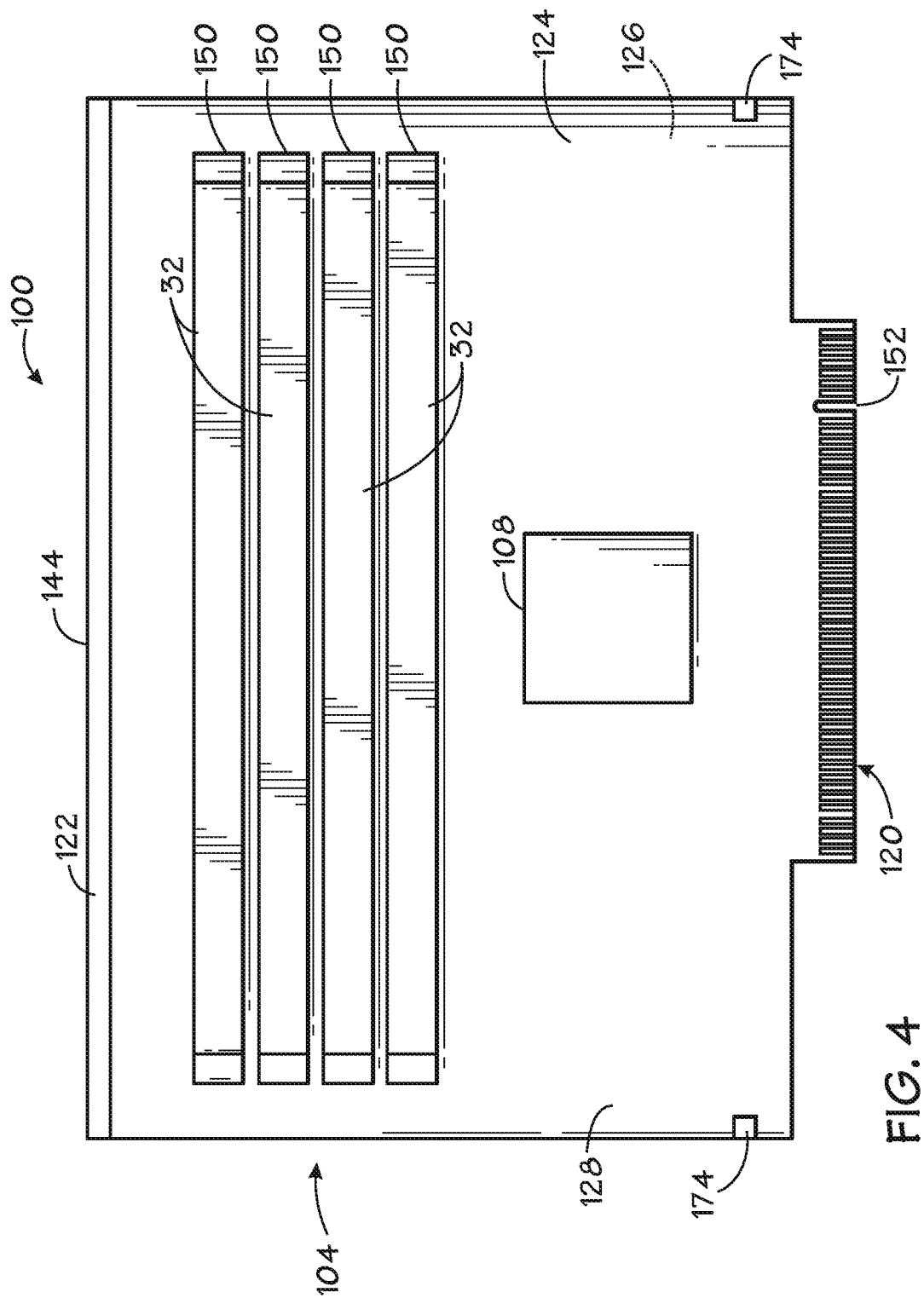
FIG. 4 is a side view of a first board of FIG. 3.
Figure 5:
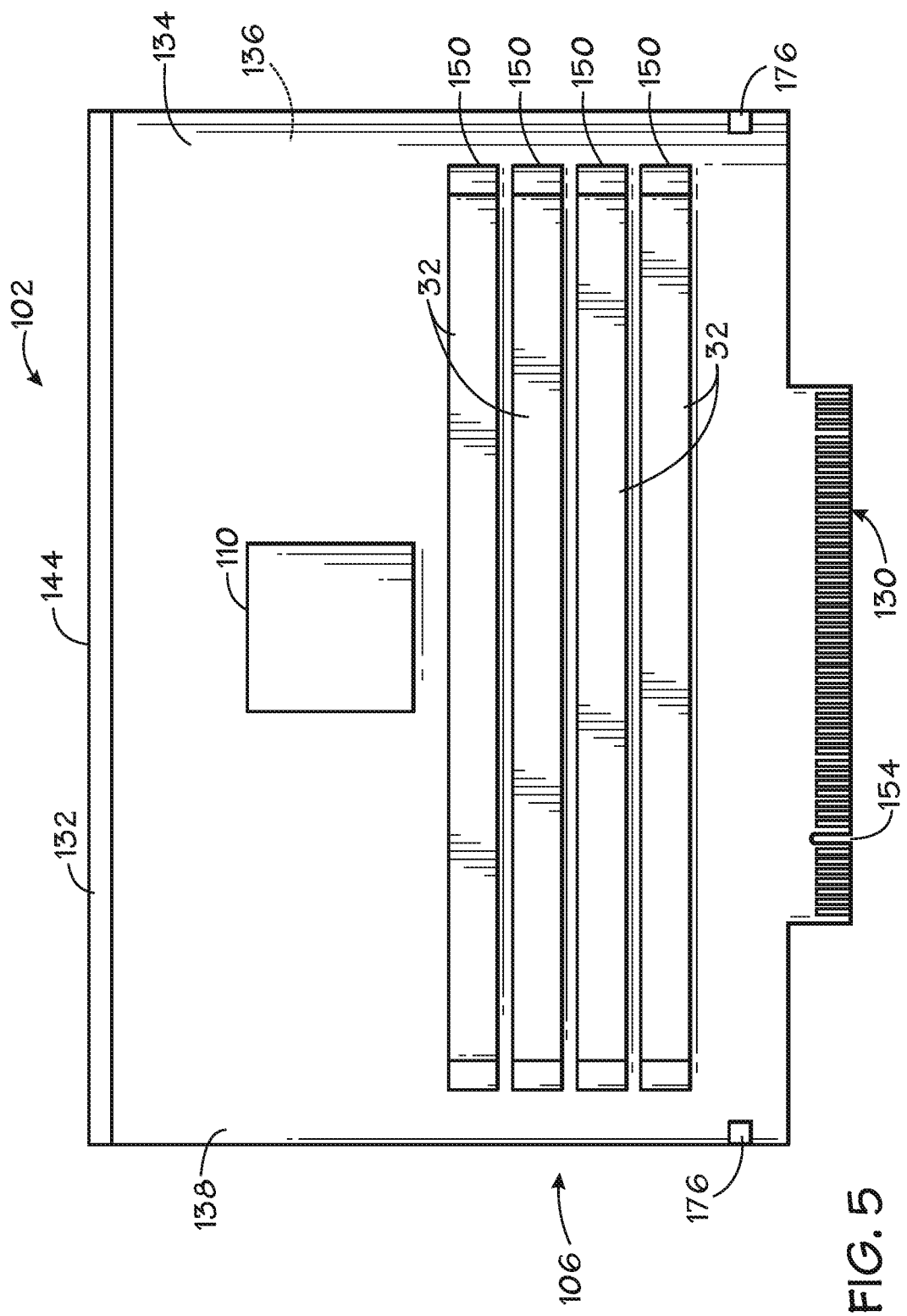
FIG. 5 is a side view of a second board of FIG. 3.

The boards 100 and 102 may provide for mounting multiple in-line memory modules 32 to a single board connector 34. For example, in the illustrated embodiment, the boards 100 and 102 each include four in-line memory sockets 150 that enable coupling four in-line memory modules 32 to the board 100. FIGS. 4 and 5 illustrate a side view of each of the first board 100 and the second board 102. In one embodiment, the sockets 150 may include a 144 pin DIMM connector, a 168 pin DIMM connector, a 184 pin DIM connector, a 200 pin DIMM connector, a 240 pin DIMM connector, or other types of edge connectors. Accordingly, the sockets 150 can provide for plugging-in and unplugging of multiple in-line memory modules 32 to the boards 100 and 102. Other embodiments may include any number of sockets 150. For example, embodiments of the boards 100 and 102 include one, two, three, four, five, six, or more sockets 150 each configured to accept an in-line memory module 32.

Further, the boards 100 and 102 each include the component regions 128 and 138. In one embodiment, each of the component regions 128 and 138 may include a surface area or keep-out region of the board that does not include sockets 150, connectors, or other components configured to couple in-line memory modules 32 to the board 100. Further, the component regions 128 and 138 may be reserved for the placement of lower profile components (e.g., IC's) that do not extend a substantial distance from the primary faces 124 and 134 of the boards 100 and 102. For example, in the illustrated embodiment, the first memory controller 108 and the second memory controller 110 are each coupled to the boards 100 and 102 in the component regions 128 and 138, respectively. In one embodiment, the memory controller 108 and 110 may include a generic memory interface device (e.g., a buffer). This may enable a bus-to-bus conversion step (e.g., DDR-3 to a high-speed memory controller to memory expander/buffer link). Further, in other embodiments, the component regions 128 and 138 may not include components, active components, and/or any components or structures that can other wise interfere with other devices and components (e.g., in-line memory modules 32) disposed proximate to the component regions 128 and 138. In other words, the component regions 128 and 138 include low profile or no components to enable in-line memory modules 32 to be disposed in the area near the component regions 128 and 138.

The boards 100 and 102 each include a connector that enables the boards to communicate with other components of the system 10. For example, each board 100 and 102 includes a set of conductive fingers that are mated with complementary conductive members internal to the board connectors 34. In other words, the boards 100 and 102 may include standard memory pins that may be plugged into standard memory sockets. Another embodiment may include a non-standard-memory socket and/or any suitable connector 34 to connect memory boards 100 and 102 to the motherboard 14. In the illustrated embodiment, the first board 100 includes the first board connection pins 120 and the second board 102 includes the second board connection pins 130. The connection pins 120 and 130 can be coupled to the board connectors 34. For example, the board connection pins 120 and 130 may include configurations for connection to a 144 pin DIMM connector, a 168 pin DIMM connector, a 184 pin DIM connector, a 200 pin DIMM connector, a 240 pin DIMM connector, or the like. The board connection pins 120 and 130 also include features that ensure correct placement of the boards 100 and 102 into the board connectors 34. For example, in the illustrated embodiment, the first board 100 includes a first notch 152, and the second board 102 includes a second notch 154. The notches 152 and 154 correspond to a complementary protrusion on the board connectors 34. For example, the notches 152 and 154 correspond to a keying feature of the corresponding mating connector 34. Other embodiments may include a plurality of notches, or notches in different locations (e.g., notches that correspond to a particular type of memory).

In one embodiment, the first and second boards 100 and 102 of the memory module 20 are mechanically coupled to one another. Mechanically coupling multiple boards may provide for alignment of the boards 100 and 102 relative to one another, as well as, enable removal of multiple boards (e.g., boards 100 and 102) simultaneously. In one embodiment, the boards 100 and 102 are coupled via the hinge 112. For example, in the illustrated embodiment, the hinge 112 includes the hinge support 142 spanning the distance between the two hinge ends 144. The hinge ends 144 are coupled to the first hinge support edge 122 of the first board 100, and the second hinge support edge 132 of the second board 102. Further, the hinge 112 includes hinge pins 140 that couple the hinge support 142 to the hinge ends 144. Accordingly, the hinge 112 enables the boards 100 and 102 to rotate relative to one another about the axes of the hinge pins 140.

Figure 6:
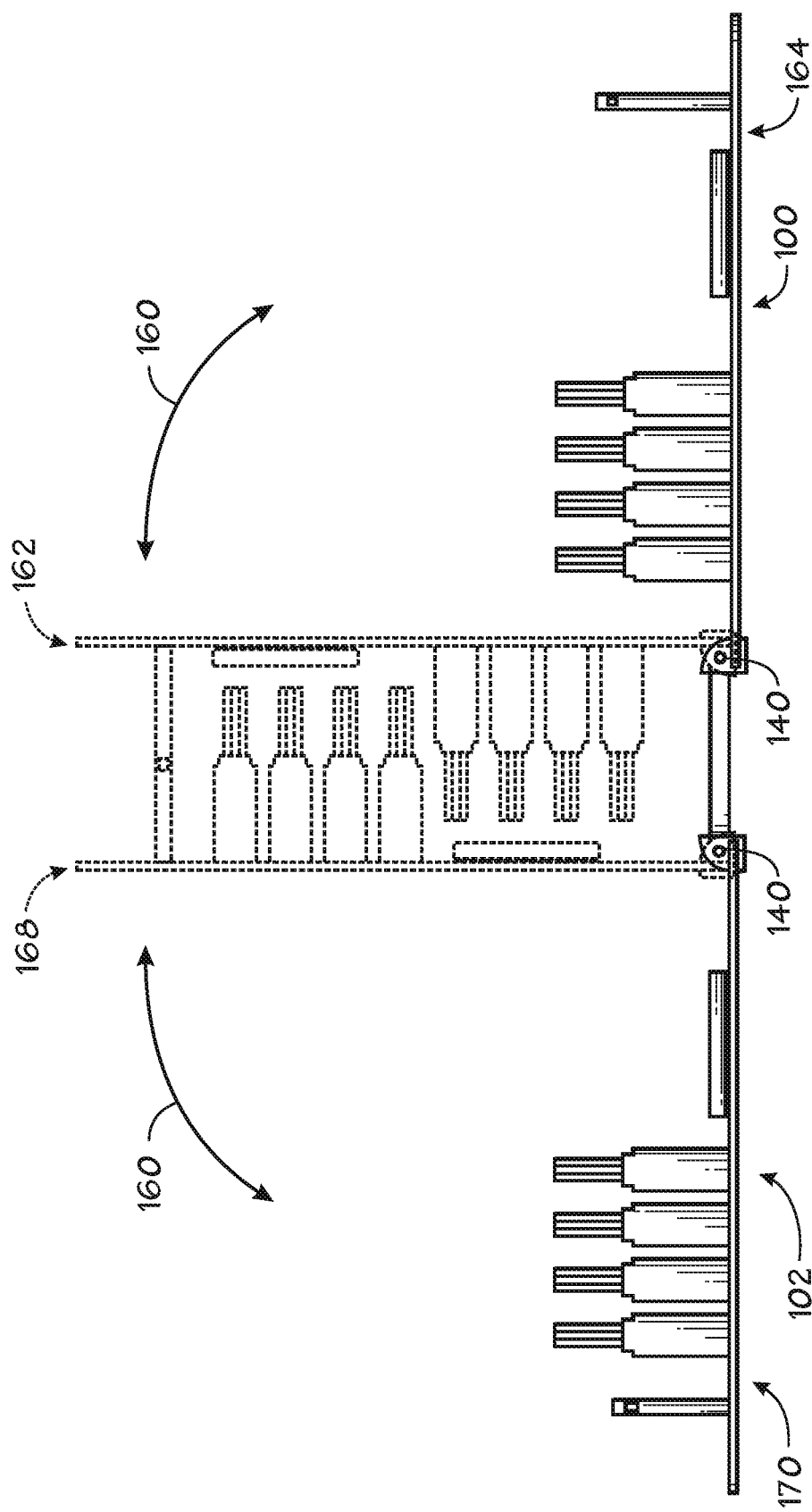
FIG. 6 is an end view of an embodiment of the memory module of FIG. 3 in opened and closed positions.

FIG. 6 illustrates an embodiment of the memory module 20 of FIG. 2 that is rotated between a closed position 162, 168 (dashed lines) and an open position 164, 170 (solid lines). In the illustrated embodiment, the first board 100 rotates about the hinge pin 140 in the direction of arrow 160 between the closed position 162 and the open position 164. Similarly, the second board 102 rotates about the hinge pin 140 in the direction of arrow 166 between the closed position 168 and the open position 170.

In an embodiment that includes both boards 100 and 102 in a closed (e.g., folded or closed book) position, the memory module 20 may be configured for installation into the connectors 34 of the computer system 10. For example, when the first board 100 is in the closed position 162 and the second board 102 is in the closed position 168, the memory module 20 can be plugged into the board connectors 34, as illustrated in FIGS. 2 and 3. In the closed position, the boards 100 and 102 are disposed parallel and offset from one another. The offset is provided via the length of the hinge 112, for instance.

The layout of the boards 100 and 102 enables the boards 100 and 102 to be closed with minimal interference between the components (e.g., the in-line memory modules 32) of the memory module 20. For example, in the illustrated embodiment, the first set of in-line memory modules 104 are disposed near a top portion of the first board 100, and the component region 128 is located in a lower portion of the first board 100 adjacent to the first set of memory modules 104. Similarly, the second board 102 includes the second set of in-line memory modules 106 disposed near a lower portion of the second board 102, and the component region 138 is located in an upper portion of the second board 102 adjacent to the second set of memory modules 106. Accordingly, the complementary layout of the boards 100 and 102 enables positioning (e.g., closing) the boards 100 and 102 without interference between the components (e.g., in-line memory modules 32). For example, when the memory module 20 is closed, the first set of in-line memory modules 104 is disposed proximate the component region 138 of the second board 102, and the second set of in-line memory modules 106 is disposed proximate to the component region 128 of the first board 100. Thus, the first set of in-line memory modules 104 and the second set of in-line memory modules 106 overlap in the separate regions 128 and 138 between the generally parallel closed boards 100 and 102. The overlap between the modules may reduce the distance between the boards 100 and 102. It is noted that the overlap may create interference between the in-line memory modules 32 if the second board 102 was separately removed from the board connectors 34 of the system 10 with the first board 100 installed. However, coupling the boards 100 and 102 via the hinge 112 enables the boards 100 and 102 to be removed simultaneously to reduce or eliminate the potential for interference.

Further, in an open (e.g., unfolded or open book) position the memory module 20 may enable increased access to the primary faces 124 and 134 of the boards 100 and 102, and increased access to the in-line memory modules 32. For example, in the embodiment illustrated in FIG. 6, when the first board 100 is in the open position 164, and the second board 102 is in the open position 170, the boards 100 and 102 are disposed parallel and in the same plane, such that each of the in-line memory modules 32 are accessible. In other words, the memory module 20 is unfolded such that a user may plug-in or un-plug the in-line memory modules 32 with reduced interference.

The memory module 20 may also include a device that blocks or reduces the likelihood of the boards 100 and 102 opening inadvertently. For example, in the illustrated embodiment, the memory module 20 includes the clasp 114. The clasp 114 enables coupling of the boards 100 and 102 such that the boards 100 and 102 do not rotate independently, and, thus may block the memory module 20 from opening inadvertently. For example the clasp 114 includes a first clasp member 174 coupled to the first board 100, and a second clasp member 176 coupled to the second board 102. The clasp members 174 and 176 are mechanically coupled to fix the boards 100 and 102 relative to one another. For example, in the illustrated embodiment, the first member 174 includes a bump 178 that is received by a complementary recess 180 of the second member 176.

In other embodiments, the clasp 114 may simply provide for spacing between the boards 100 and 102. Enabling the boards 100 and 102 to maintain a minimum distance may prevent the boards 100 and 102 from rotating into one another, which could otherwise result in interference between the in-line modules 32 and/or other components of the memory module 20. For example, in one embodiment, the clasp 114 may include a single member coupled to the first board 100 or the second board 102. In such an embodiment, the clasp 114 acts as a spacer (e.g., bumper) between the boards 100 and 102. In another embodiment, the clasp 114 may include the first and second members 174 and 176 disposed between the boards such that they maintain a distance between the two boards 100 and 102, but do not mechanically couple. Accordingly, such an embodiment may provide a two piece spacer (e.g., bumper) that does not to prevent the boards 100 and 102 from opening.

Further, the memory module 20 may also include features to regulate the amount each board 100 and 102 is rotated. For example, in one embodiment, the hinge 112 may include a stop that blocks the boards from opening, or that enables the boards to open in a particular sequence (e.g., first board 100 unfolds and, then, the second board 102 folds open). In addition, in certain embodiments, the stop blocks the boards 100 and 102 from rotating into one another (e.g., past the closed positions 162 and 168). For example, the hinge pin 140 may include a protrusion that contacts a complementary protrusion on the hinge end 144 to resist further rotation of the boards 100 and 102.

Figure 7:
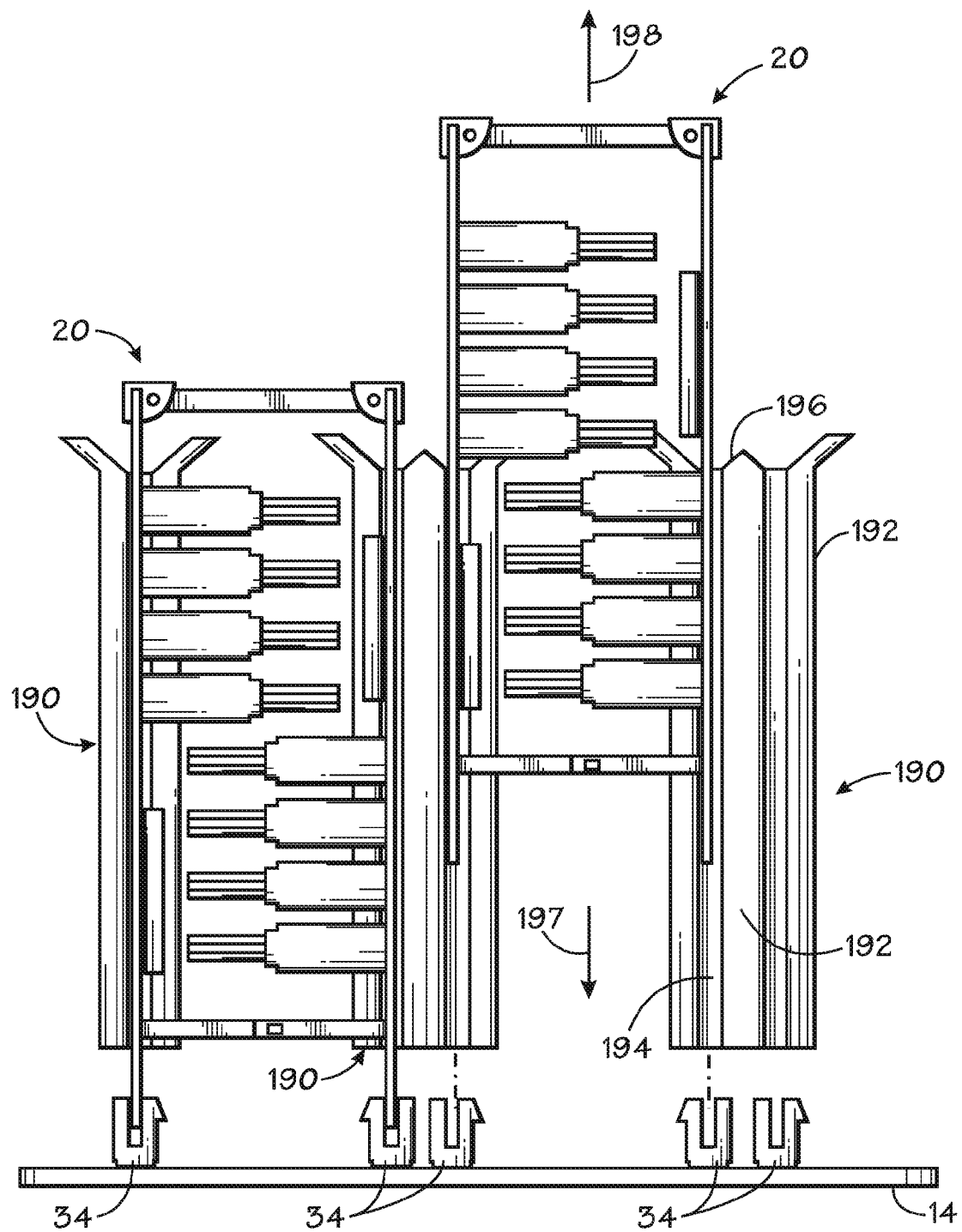
FIG. 7 is an end view of an embodiment of a plurality of the memory module of FIG. 3 disposed in a guide.

As discussed previously, coupling the boards 100 and 102 into the memory module 20 may enable installation and removal of a plurality of boards 100 and 102 and in-line memory modules 32 into the system 10. For example, the memory module 20 may be installed into the system 10 via simultaneously engaging the board connectors 34 with the connection pins 120 and 130 of the first and second boards 100 and 102. Although this technique may prove effective, the system 10 may also include additional features to aid in alignment of the memory module 20 to the system 10. FIG. 7 illustrates an embodiment of guide 190 that provides for alignment of the memory module 20 during the installation and removal of the memory module 20 from the system 10. For example, in the illustrated embodiment, the guide 190 includes a guide body 192, a guide rail 194, and a guide catch 196. In the illustrated embodiment, the boards 100 and 102 are each disposed into the guide rail 194 to align the boards 100 and 102 with the complementary board connector 34. In other words, the guide 190 enables alignment of the boards 100 and 102 to provide an aid during installation and removal of the memory module 20. For example, the guide 190 may align the boards 100 and 102 to the connectors 34 when the memory module 20 is installed in the direction of arrow 197, and/or removed in the direction of arrow 198. The guide 190 can also prevent the boards 100 and 102 from misaligning with the connector 34 and from contacting other components in the system 10. Accordingly, the guide 190 may reduce the potential for damage to the boards 100 and 102, connectors 34, connection pins 120 and 130, and the like.

Further, each of the guides 190 provides for alignment of multiple boards 100 and 102. For example, in the illustrated embodiment, the guide 190 includes a single body 192 having two rails 194 (e.g., slots). Thus, the guide 190 may be placed proximate to two board connectors 34 such that the guide 190 accepts both boards 100 and 102 from each of two memory modules 32. In other embodiments, the guide 190 includes a version of the body 192 that provides for the alignment of any number of boards 100 and 102 and/or memory modules 32. For example, as single guide 190 may include sixteen guide rails 194, and, thus, be capable of supporting and aligning up to eight memory modules 20 (e.g., sixteen boards 100 and/or 102).

The guides 190 also include features conducive to the insertion of the boards 100 and 102 into the guide rails 194. For example, in the illustrated embodiment, each of the guide rails 194 includes the guide catch 196. The guide catch 196 includes a geometry that helps prevent any misalignment of the boards 100 and 102 as they are inserted into the slots 194. For example, in the illustrated embodiment, the guide catch 196 includes a chamfer or Y-shaped geometry. In other embodiments, the guide catch 196 may be widened, or the guide catch 196 may include other features to receive the boards 100 and 102. For example, the guide catch 196 may include multiple stages that narrows into the guide rail 194.

In one embodiment, the guide 190 is coupled to the chassis 28 to provide alignment relative to the board connectors 34. For example, in one embodiment, the guides 190 are fastened to the chassis 28 via a screw or clip. In other embodiments, the guides 190 may be fastened relative to the board connectors 34 in other manners. For example, in one embodiment, the guide body 192 can be coupled directly to the motherboard 14. In another embodiment, the guide body 192 is formed integral with the connector 34. In other words, the connector 34 may include the guide 190.

Figure 8:
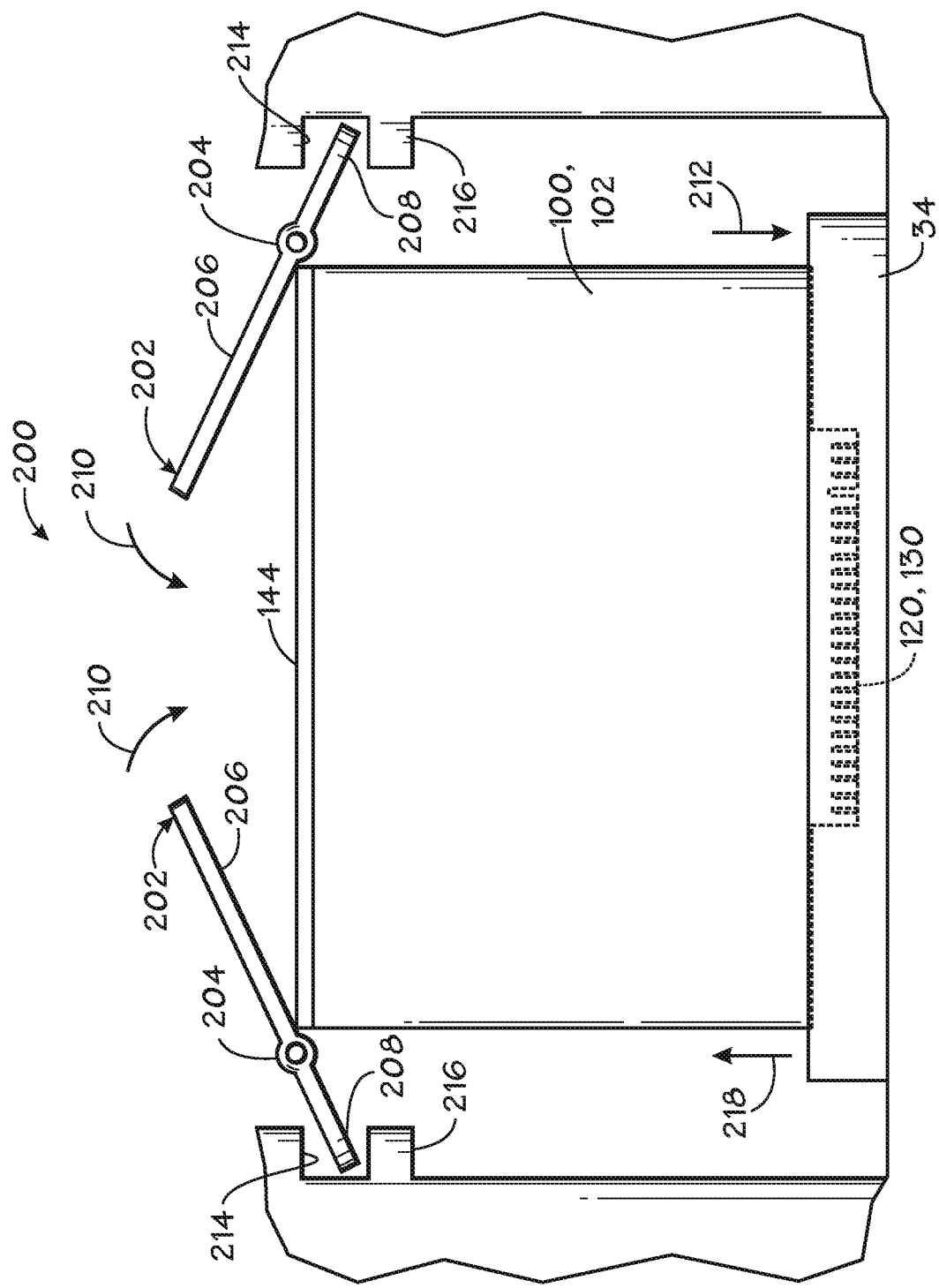
FIG. 8 is a side view of an embodiment of the memory module of FIG. 3 including a latching mechanism.

The memory module 20 may also include a latching mechanism 200 to provide for installation and removal of the memory module 20 from the system 10. In one embodiment, the latching mechanism 200 includes a plurality of latches 202. For example, FIG. 8 illustrates an embodiment including two latches 202 disposed on the hinge 114. In the illustrated embodiment, each of the latches 202 includes a hinge 204, a handle 206, and a locking tab 208. In operation, the latches 202 are rotated in the direction of arrows 210 to urge the boards 100 and 102 of the memory module 20 in the direction of an arrow 212. In other words, the latching mechanism 200 may include a cam that is rotated to move the boards 100 and 102. For example, pressing on the handles 206 in the directions of arrows 210 rotates the latches 202 about the hinge 204 such that the locking tab 208 engages a complementary locking ridge 214. Accordingly, in certain embodiments, the board connection pins 120 and 130 are urged in the direction of the arrows 210 to engage the board connector 34. Thus, the memory module 20 may be set and locked into the connector 34. Similarly, other embodiments may include second locking ridges 216 that may urge the memory module 20 in the direction of an arrow 218. For example, rotating the latches 202 in the opposite direction of the arrows 210 causes the locking tabs 208 to react against the second locking ridges 216 to urge the memory module 20 out of the connector 34. Other embodiments may include latching mechanisms 200 in a variety of other configurations. For example, embodiments may include a single latching mechanism 200, a latching mechanism 200 disposed on the boards 100 and/or 102, the latching mechanism 200 integral to the connectors 34, the latching mechanism integral to the guide 190, and the like.

Figure 9:
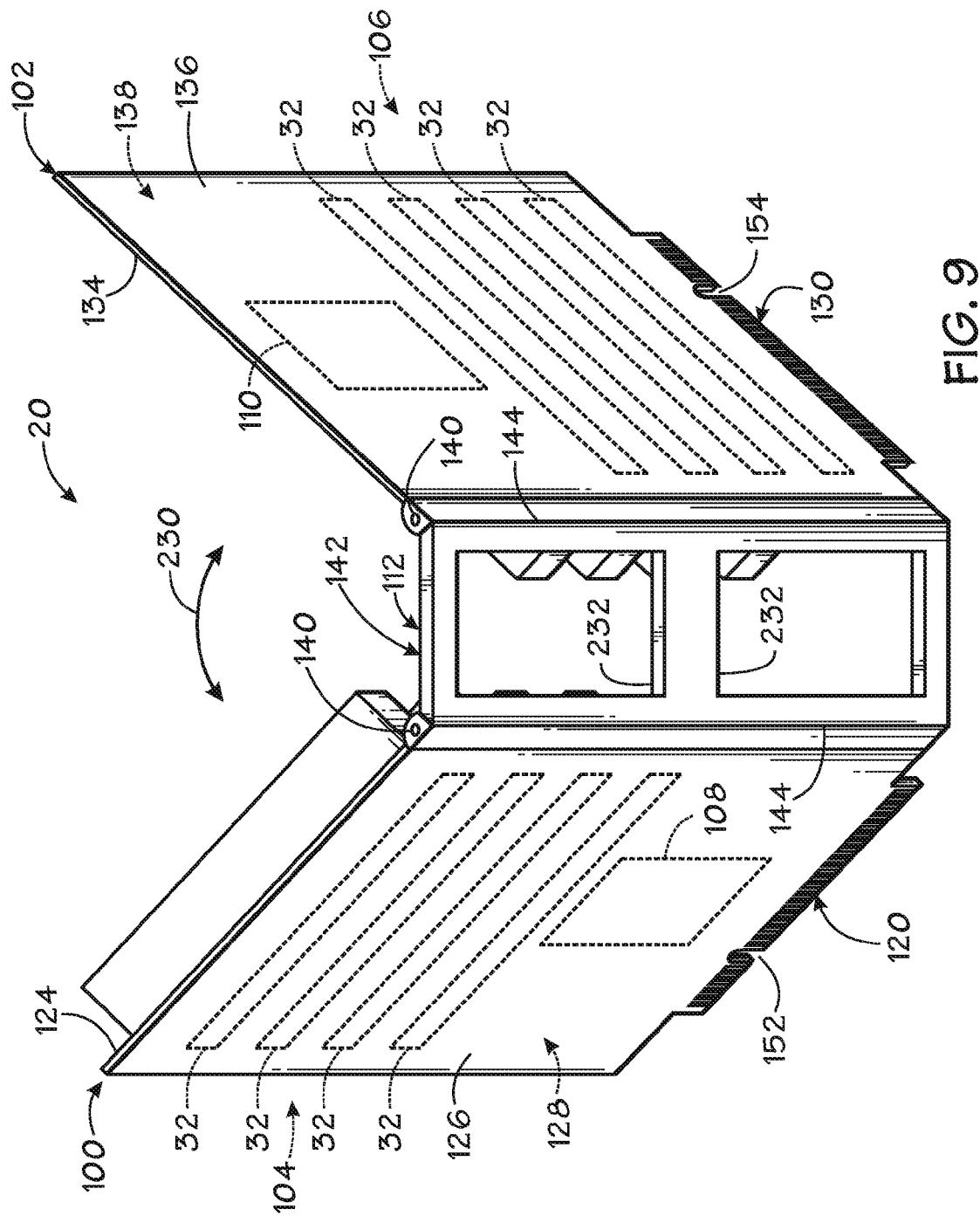
FIG. 9 is a perspective view of an embodiment of the memory module of FIGS. 1 and 2 including a vertical hinge.

The memory module 20 may include any variety of hinge 112 configurations that enable the boards 100 and 102 of the memory module 20 to be folded. For example, in the previously discussed embodiments, the memory module 20 includes the hinge 112 coupled to the first hinge support edge 122 of the first board 100 and the second hinge support edge 132 of the second board 102, and the hinge 112 having a generally horizontal hinge 112 orientation. FIG. 9 illustrates an embodiment of the memory module 20 that includes an alternate configuration of the hinge 112. In the illustrated embodiment, the memory module 20 includes the hinge 112 oriented vertically. In other words, the hinge 112 is disposed along a vertical edge of the boards 100 and 102 (e.g., an edge of the boards 100 and 102 that is generally perpendicular to the edge of the boards 100 and 102 that includes the connection pins 120 and 130). In such a configuration, the first board 100 and the second board 102 rotate in the direction of arrow 230 about the hinge pins 140. Accordingly, the memory module 20 may be closed (folded) to enable installation of the first board 100 and the second board 102 into boards connector 34, and the memory module 20 may be opened (e.g., unfolded) to enable access to the in-line memory modules 32 with minimal mechanical interference.

Further, certain embodiments of the memory module 20 may include features that are conducive to operation of the system 10. For example, the memory modules 20 include cutouts that enable air to flow between components of the system 10. For example, in the illustrated embodiment of FIG. 9, the hinge support 142 includes cutouts 232. The cutouts 232 provide a path for airflow in a direction generally parallel to the in-line memory modules 32. Further, the cutouts 232 may reduce the overall weight of the module 20, and or may reduce the cost of materials associated with the hinge 112. Similarly, the embodiments of the memory module 20 including a horizontally oriented hinge (see FIGS. 3-8) may include cutouts 232 or other features conducive to the operation of the system 10. In addition, embodiments of the memory module 20 including the vertically oriented hinge 112 may include features similar to those described with regard to the memory module 20 including the horizontally oriented hinge 112. For example, the memory module 20 including a vertically oriented hinge may include the latching mechanism 200, hinge stops, and features (e.g., board edges) that enable the memory module 20 to be engaged into the guide 190.

Figure 10:
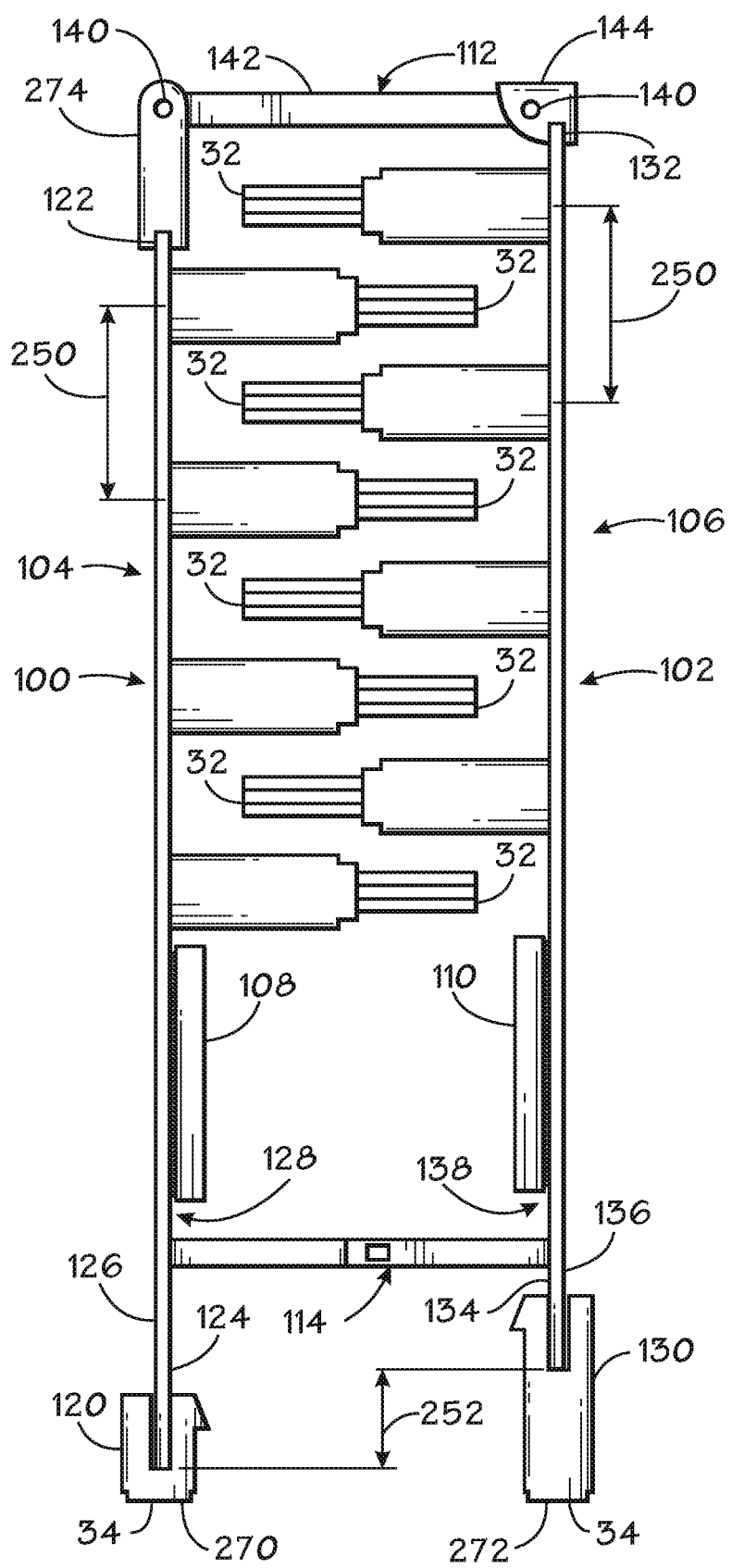
FIG. 10 is an end view of another embodiment of the memory module of FIGS. 1 and 2.

FIG. 10 illustrates an embodiment of the memory module 20 including an alternate layout of components. In the illustrated embodiment, the boards 100 and 102 each include in-line memory modules 32 that are disposed proximate to one another, and having an offset 250 between each of the in-line memory modules 32. The offset 250 enables the boards 100 and 102 to be disposed proximate to one another such that the in-line memory modules 32 are disposed in an alternately-overlapping configuration. In other words the boards 100 and 102 include spacing (e.g., offset 250) between each of the in-line modules 32 of the boards 100 or 102 such that a third in-line module 32 can be disposed between two in-line modules 32 coupled to the board 100 or 102. For example, in the illustrated embodiment, the first board 100 and the second board 102 are folded closed, and the first board 100 is disposed lower than the second board 102 by a board offset distance 252. In certain embodiments, the board offset distance 252 is approximately one-half of the offset 250. Accordingly, when the memory module 20 is folded to the closed position, as illustrated, the first set of in-line memory modules 104 are staggered to overlap with the second set of in-line memory modules 106 in an alternating fashion (e.g., an in-line memory module 32 of the first set 104, adjacent to an in-line memory module 32 of the second set 106). In other embodiments, the offset distance 250 may be increased or decreased, and/or the board offset distance 252 may be varied to modify the spacing between the in-line memory modules 32. Further, other embodiments may include disposing the second board 102 lower than the first board 100 by a board offset distance 252. It should also be noted that in the illustrated embodiment, the component regions 128 and 138 are disposed such that they are generally opposing the sets of in-line memory modules 104 and 106.

Figure 11:
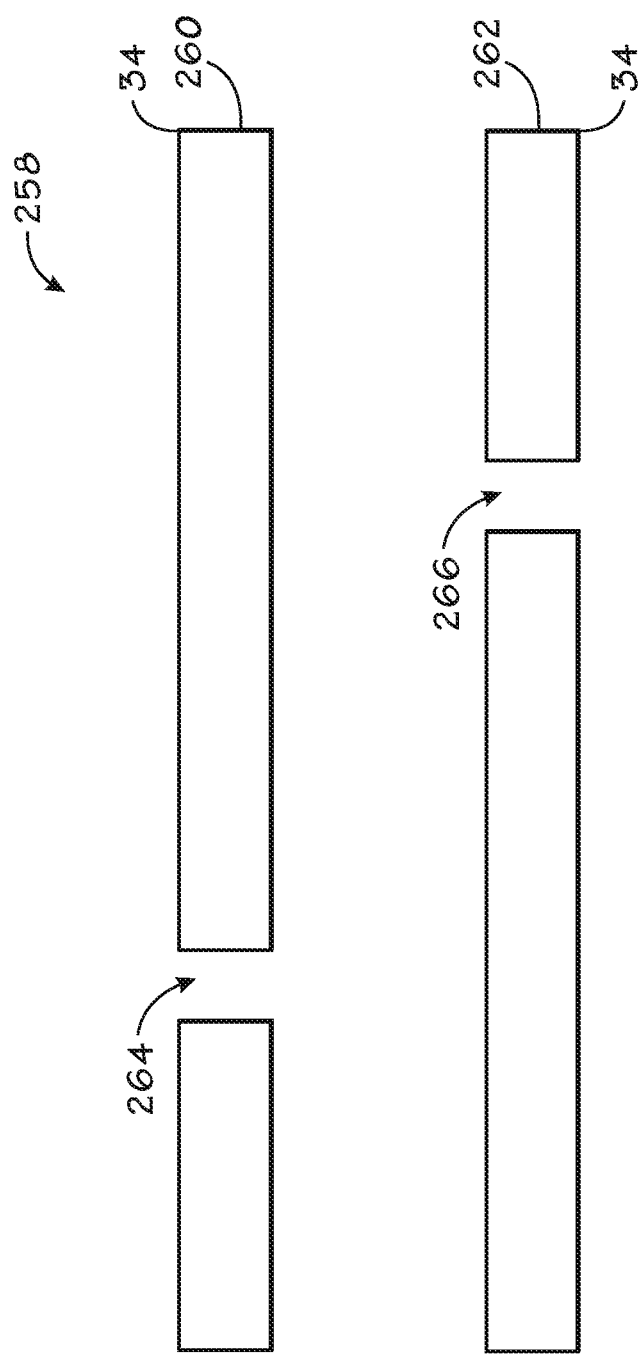
FIG. 11 is a block diagram of a connector layout of the memory modules of FIG. 10.

The embodiment illustrated in FIG. 10 may enable a single board design to be shared between the first board 100 and the second board 102. For example, because the boards share components (e.g., in-line memory modules 32, memory processors 108 and 110, and connection pins 120 and 130) are located in similar regions, the boards 100 and 102 may be identical. However, it should be noted, that in such an embodiment, the board connectors 34 may be disposed in opposite directions to account for the board 100 or 102 facing opposite directions. For example, FIG. 11 illustrates an embodiment of a connector layout 258 that enables the first board 100 and the second board 102 to be interchangeable. In the illustrated embodiment, the first board connector 260 is rotated 180 degrees relative to the second connector 262. In other words, a first gap 264 in the first connector 260 is disposed at the opposite end from the second gap 266 in the second connector 262. Accordingly, the first board 100 may be plugged into the first connector 260, or rotated 180 degrees and plugged into the second connector 262. As will be appreciated, this connector layout 258 may be included in other embodiments. For example, the connector layout 258 of FIG. 11 may be incorporated into the embodiments of FIGS. 3-9, to enable the memory module 20 to be inserted as illustrated, or rotated 180 degrees and inserted. Other embodiments include various types of connectors 34. For example, embodiments include connectors 34 with alternate keying (e.g., gaps 264 and 266) for use with a various memory types.

The board connectors 34 may also be varied to account for the board offset distance 252. In one embodiment, the connectors 34 may include varying heights to account for the board offset distance 252. For example, in the illustrated embodiment of FIG. 10, a first board connector 270 includes a height that is less than a second board connector 272. The difference in height is the board offset distance 252. Thus, the first board 100 disposed in the first connector 270 is offset from the second board 100 disposed in the second connector 272. In other embodiments, the connectors 34 may be of similar heights, and the in-line memory modules 32 offset by the board offset distance 252. For example, in an embodiment where the board connector 34 are the same or a similar height, the layout of the first board 100 and the second board 102 may not be identical (e.g., the second board 102 may include a greater distance between the second connection pins 130 and the second set of in-line memory modules 106). The varied layout may provide the staggering between the first set of in-line memory modules 104 and the second set of in-line memory modules 106.

Further, the hinge 112 may include features that enable the in-line memory modules 32 to include an alternate-overlapping configuration. For example, in the illustrated embodiment, the hinge 112 includes a hinge extension 274 that accounts for the board offset distance 252. In other words, the hinge extension 274 accounts for the first board 100 being disposed slightly lower than the second board 102 due to the board offset distance 252. Accordingly, the hinge 112 is coupled to the first board 100 via the hinge pin 140 and the hinge extension 274, and coupled to the second board 102 via the hinge pin 140 and the hinge end 144. Other embodiments may include variations of the hinge 112. For example, the hinge 112 may include an L-shaped hinge support 142 (e.g., similar to the illustrated hinge support 142 and the hinge extension 274) that couples to the first board 100 via the hinge pin 140 located proximate to the hinge support edge 122. Further, embodiments may include a hinge 112 similar to the hinge illustrated in FIGS. 3-9. For example, the first board 100 may have an increased height (e.g., in the direction of the illustrated hinge pin 140 of the hinge extension 274), such that the hinge extension 274 is not used. Other embodiments include numerous variations that enable the in-line memory modules 32 to overlap in an alternating arrangement. For example, an embodiment may include a vertically oriented hinge 112, as illustrated in FIG. 9.

The system 10 can include any combination of the discussed embodiments. In one embodiment, the system 10 may include multiple memory modules 20 of the same or similar design, or may include a combination of the embodiments. For example, returning now to FIG. 2, the illustrated embodiment includes four memory modules 20 including an offset and overlapping arrangement (similar to FIG. 3), and four memory modules 20 including an alternating and overlapping arrangement (similar to FIG. 10). In the illustrated embodiment, multiple connectors 34 are located in pairs on the motherboard 14. For example, each equally spaced pair of connectors 34 is offset from other pairs of connectors 34, wherein each pair supports the memory module 20. Accordingly, multiple memory modules may be disposed across the width of the chassis 28. As will be appreciated, each of the memory modules 20 may also include the features discussed above or any combination thereof to provide the desired performance.

What is claimed is:
1. A system, comprising:
a memory module comprising:

a first board comprising a first plurality of memory receptacles configured to support a first plurality of in-line memory modules in an overlapping relationship with a second plurality of in-line memory modules disposed on a second board, the second plurality of memory receptacles configured to support the second plurality of in-line memory modules; and a hinge that directly couples the first board to the second board, wherein the hinge allows for movement of the first board relative to the second board about the axes of the hinge and wherein the hinge is coupled to a first hinge support edge of the first board and a second hinge support edge of the second board.

2. The system of claim 1, wherein the hinge is disposed in a horizontal orientation relative to first and second edge connectors of the first and second boards, respectively.

3. The system of claim 1, wherein the hinge is disposed in a vertical orientation relative to first and second edge connectors of the first and second boards, respectively.

4. The system of claim 1, comprising a latching mechanism configured to secure the memory module to a connector.

5. The system of claim 1, wherein the memory module comprises a clasp, a bumper, a clip, or a combination thereof.

6. The system of claim 1, comprising a chassis, a motherboard, or a combination thereof, having a guide configured to align the first board into a mounted position.

7. The system of claim 1, wherein the first board is configured to support at least one or more in-line memory modules.

8. The system of claim 1, wherein the overlapping relationship comprises separate first and second groups of the first and second plurality of in-line memory modules disposed on the first and second boards, respectively, wherein the first and second groups are disposed in separate regions between the first and second boards when the first and second boards are folded together.

9. The system of claim 1, wherein the overlapping relationship comprises a staggered arrangement of the first and second plurality of inline memory modules alternating one after another in a region between the first and second boards when the first and second boards are folded together.

10. The system of claim 1, comprising a memory controller coupled to the first board.

11. The system of claim 1, comprising a memory controller coupled to the second board.

12. The system of claim 1, comprising a generic memory interface device coupled to the first board.

13. The system of claim 1, comprising a generic memory interface device coupled to the second board.

14. The system of claim 1, comprising a computer system having the memory module, a processor, a disk drive, a hard drive, a video card, an audio card, a motherboard, a monitor, a printer, or a combination thereof.

15. A system, comprising:
a circuit board comprising a first board connector and a second board connector configured to support first and second memory boards comprising first and second plurality of memory receptacles configured to support first and second in-line memory modules respectively, overlapping with one another, wherein the first and second memory boards are directly coupled to a first hinge support edge and a second hinge support edge of a hinge that allows for movement of the first memory board relative to the second memory board about the axes of the hinge, wherein the first and second memory boards are disposed between the hinge and the first and second board connectors.

16. The system of claim 15, further comprising:
a third board connector and a fourth board connector configured to support third and fourth memory boards having in-line memory modules overlapping with one another;
wherein the first board connector and the second board connector are separated by a first distance from one another on the circuit board, and the third board connector and the fourth board connector are separated by the first distance from one another on the circuit board, the first board connector and the third board connector are separated by a second distance that is greater than the first distance, and the second board connector and the fourth board connector are separated by the second distance from one another.

17. The system of claim 15, comprising the first memory board disposed in the first board connector and configured to support the first plurality of in-line memory modules in an overlapping relationship with the second plurality of in-line memory modules disposed on the second board disposed in the second board connector.

18. The system of claim 15, comprising a first guide configured to align the first memory board to the first board connector, a second guide configured to align the second memory board to the second board connector, or a combination thereof.

19. The system of claim 15, wherein the first board connector and the second board connector comprise different heights relative to the circuit board.

20. The system of claim 15, wherein the orientation of the first board connector is rotated 180 degrees from the orientation of the second board connector.

21. A system, comprising:
a memory module comprising:
a first memory board comprising a first plurality of memory receptacles configured to support a first plurality of memory modules;
a second memory board comprising a memory receptacles configured to support a second plurality of memory modules in an overlapping relationship with the first plurality of memory modules; and
a hinge that directly couples the first board to the second board, wherein the hinge allows for movement of the first board relative to the second board about the axes of the hinge and wherein the hinge is coupled to a first hinge support edge of the first board and a second hinge support edge of the second board; and
a circuit board comprising a first board connector and a second board connector configured to support the first memory board and the second memory board, wherein the first and second memory board are disposed between the hinge and the first and second board connectors.

22. The system of claim 21, wherein the hinge is disposed in a horizontal orientation relative to first and second board connectors.

* * * * *

UNITED STATES PATENT AND TRADEMARK OFFICE
CERTIFICATE OF CORRECTION

PATENT NO. : 8,537,563 B2
APPLICATION NO. : 11/859601
DATED : September 17, 2013
INVENTOR(S) : Brian T. Purcell et al.

Page 1 of 1

It is certified that error appears in the above-identified patent and that said Letters Patent is hereby corrected as shown below:

In the Specification

In column 5, line 36, after "includes" insert -- a --.

In column 5, line 40, delete "tow" and insert -- two --, therefor.

In column 5, line 45, delete "substantial" and insert -- substantially --, therefor.

In column 5, line 50, delete "20-1, 20-1." and insert -- 20-1, 20-2. --, therefor.

In column 5, line 57, after "board" insert -- 100 --.

In column 5, line 66, delete "includes" and insert -- include --, therefor.

In column 6, line 1, delete "13" and insert -- 13, --, therefor.

In column 6, line 2, delete "34-A 34-B 34-C 34-D" and
insert -- 34-A, 34-B, 34-C, 34-D --, therefor.

Signed and Sealed this
Fourth Day of February, 2014

Michelle K. Lee
*Deputy Director of the United States Patent and Trademark Office*